United States Patent [19]

Naiff

[11] 4,404,655
[45] Sep. 13, 1983

[54] DATA SENSE APPARATUS FOR USE IN MULTI-THRESHOLD READ ONLY MEMORY

[75] Inventor: Kenneth L. Naiff, Hauppauge, N.Y.

[73] Assignee: General Instrument Corporation, New York, N.Y.

[21] Appl. No.: 229,717

[22] Filed: Jan. 28, 1981

[51] Int. Cl.³ .................... G11C 7/00; G11C 11/56; G11C 17/00
[52] U.S. Cl. .................................. 365/104; 365/168
[58] Field of Search ............... 365/103, 104, 105, 168, 365/45

[56] References Cited

U.S. PATENT DOCUMENTS

| 4,192,014 | 3/1980 | Craycraft | 365/104 |
| 4,202,044 | 5/1980 | Beilstein, Jr. et al. | 365/182 |
| 4,272,830 | 6/1981 | Moench | 365/45 |
| 4,287,570 | 9/1981 | Stark | 365/104 |

FOREIGN PATENT DOCUMENTS

| 54-158134 | 12/1979 | Japan | 365/104 |
| 54-161853 | 12/1979 | Japan | 365/104 |

OTHER PUBLICATIONS

IEEE Transactions on Electron Devices, vol. ED-21, No. 6, Jun. 1974, pp. 324-331, "Ion Implantation for Threshold Control in Cosmos Circuits," E. C. Douglas et al. Copy in ACI 254.

Primary Examiner—George G. Stellar
Attorney, Agent, or Firm—Roland Plottel

[57] ABSTRACT

A read only memory in which the memory cells are single metal gate or silicon gate field effect transistors. Each FET has one of several different thresholds or states. The size or area of the FET gates at the surface of the semiconductor chip are substantially the same regardless of the cells threshold or state. The input to the gates is a ramp, and the cells are rendered conducting by the amplitude of the ramp at a given instant. The output of a cell is fed to several flip-flops, which are synchronized with the input ramp, thereby setting the flip-flops in accordance with the threshold or state of the cell. An encoder converts the output from the flip-flops to a bit binary signal. This permits a very high density ROM, e.g. 128K on a single chip. In another embodiment the input to the gates is a step, and the cells are all rendered conducting simultaneously. The amount of current drawn by each gate however, depends upon the doping in the gate region. The amplitude of the current being drawn by a selected cell is compared with the reference, this in turn is decoded to indicate the state of that cell.

11 Claims, 5 Drawing Figures

DATA SENSE APPARATUS FOR USE IN MULTI-THRESHOLD READ ONLY MEMORY

BACKGROUND OF THE INVENTION

1. Field of the Invention

The invention relates to semiconductor integrated circuits and particularly to read only memories.

2. Description of the Prior Art

The read only memory (ROM) is a well-known circuit used in great quantities in computers, calculators and in almost all digital systems. Conventional integrated circuit ROMs include on a single chip not only the ROM array, which is made of ROM or memory cells, but also attendant circuits, such as input and output ports, address register and decoder, control, multiplexer, buffers, timing circuits and the interconnections. The size of the ROM, related to the number of cells in the array, is constantly growing and 32,000 bit ROM are presently commercially available. Current activity is to design still larger ones, 64K, and it is desirable to have still larger ones, all on a single chip.

A typical ROM cell has a single FET transistor with a source-drain connection that is either complete or open, e.g. inoperable. When the ROM cell is interrogated; and if it has an open circuit, then it gives an output signal of one logic level, e.g. a signal representing "1;" and if it has a completed circuit, it gives the other logic level, e.g. a signal representing "0."

In one type of ROM circuit, the FETs that make up the ROM array are fixed during fabrication. During one masking step selected ROM cells which are to give the logic "1" have their source drain circuit rendered effectively inoperable. Thus, each ROM cell has a permanently stored logic 1 or logic 0, and gives the logic 1 or logic 0 response to an input signal.

An introductory explanation of ROMs, the mask programmable ROM cell, the complete ROM array, and ROM chip, may be found in Brice Ward, MICRO PROCESSOR/MICRO PROGRAMMING HANDBOOK, 1975, Blue Ridge Summit, Pa.

A classic and historic goal in the design and manufacture of ROMs is to have more data on a single chip. Single chip ROMs in the past decade have increased from 256 bits to approximately 1,000 to 2,000, 4,000, 8,000, 16K, 32K, and talk is currently of 64K and larger. The present invention greatly increases, e.g. doubles, the capacity of a ROM chip, without substantially increasing its physical size, and makes possible 128K ROMs with current manufacturing capability using established metal gate processing. In other words, with the present invention, ROM arrays can be made using half the area previously required.

The concept can be quite simply stated. Instead of building a ROM array, as was done in the prior art, with the existence or non-existence of an operable FET in each cell, the ROM array of this invention uses a FET in each cell that has one of several different thresholds. If, for example, three thresholds are available ($-2.0$ volts, $+0.1$ volts, and $+0.7$ volts) then four states are now available for a given cell in the array (the fourth state, of course, is an inoperable, or non-existent FET). The four states can be compared with the prior art cell, which had only two states, and, in the prior art, to get four states two cells are required. In the present invention, the surface area of each cell is the same as each other cell, and the threshold level of each FET is not affected by this common size. Thus the invention doubles the memory size of the ROM array without increasing its physical size. Put in another way, the silicon area is halved.

Further, this invention makes possible ROMs of 128K bits by using existing metal gate processing techniques. It had been believed by some that to manufacture ROMs of 128K new process techniques would have to be perfected.

In the invention, the reduction in area is achieved by circuit innovation. The layout rules have not been compromised. Thus as new geometric shrink advances become available, the ROMs using the invention can take advantage of them.

In the present array, capacitance within the array is reduced; it is approximately halved. This has an effect on speed.

In the present invention, less power is required thus avoiding attendant problems of heating, and particularly heat dissipation. This is a classic goal in any memory array.

The manufacture of the invention is straight-forward. It does not require any radically different or new fabrication techniques from those currently in use, and which have been tried and tested. Further, as all the cells are of the same size, masking is straight-forward and thus easy to manufacture.

SUMMARY OF THE INVENTION

According to one aspect of the invention, there is provided a read only memory having a plurality of multi-state cells interconnected in a ROM matrix. Each of the cells have substantially the same surface dimensions, and one of at least three different possible states. When a particular one of the cells is to be read, an input signal varying in amplitude with time is applied to the cell and stimulates an output from the cell in accordance with the state of said cell. The output signal is one of two amplitude levels, and is displaced in time depending upon the state of the cell. A circuit receives the output and decodes which state the cell is in.

According to a further aspect of the invention there is provided a read only memory array having a plurality of cells, each of which is a field effect transistor having a gate region of substantially the same surface area and shape. A first portion of the FETs are enhancement mode devices; a second and different portion are depletion mode devices; a third and different portion have a gate region doping intermediate to that of the enhancement and depletion mode devices; and a portion of the devices are inoperable as a FET.

DESCRIPTION OF THE PREFERRED EMBODIMENTS

Figure 1:
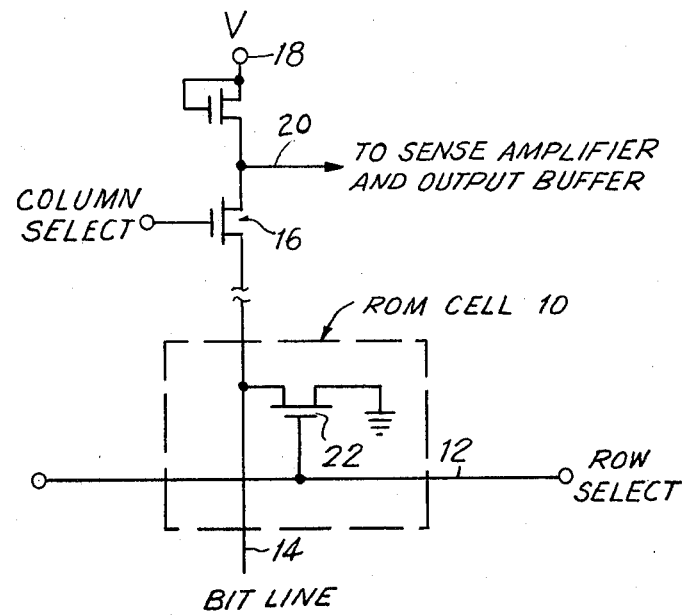
FIG. 1 is a schematic drawing of a prior art ROM cell.

FIG. 1 shows a ROM cell 10 with a row select conductor 12 and a bit line conductor 14 passing there-through. As is conventional, but not shown in FIG. 1, there are many cells adjacent one another arranged in an array with row select and bit line conductors, passing through each row and column of the array. In each bit line there is a column select gate 16, which is connected to a voltage V at a terminal 18. A source of the gate 16 is connected to an output lead 20, and on which is provided the output from each of the cells in that column.

In ROM cell 10, a metal gate FET 22 has its source connected to the bit line 14, its drain connected to ground, and its gate is connected to row select 12. The transistor 22 is fabricated to be either normally operable, or not operating, e.g. during fabrication it has been altered in the source drain connection such that it always presents an open circuit to bit line 14. When column select gate 16 is turned on, and the row select is on, there is provided at output 20, one of two voltages depending on whether FET 22 is an operable transistor or an effectively inoperable one. If it is effectively inoperable, an output voltage at 20 is, for example, a logic 1 if we are using positive logic and it would approach the voltage V. If transistor 22 is an operable one, then it conducts and there is a conducting path between its source and drain, and the potential on output 20 approaches ground which represents a logic 0.

As noted above, there are many ROM cells in the ROM array, and they are interconnected in a matrix with row select and bit line conductors. There is also circuitry on the ROM chip for ushering around the bits to their proper positions.

Figure 2:
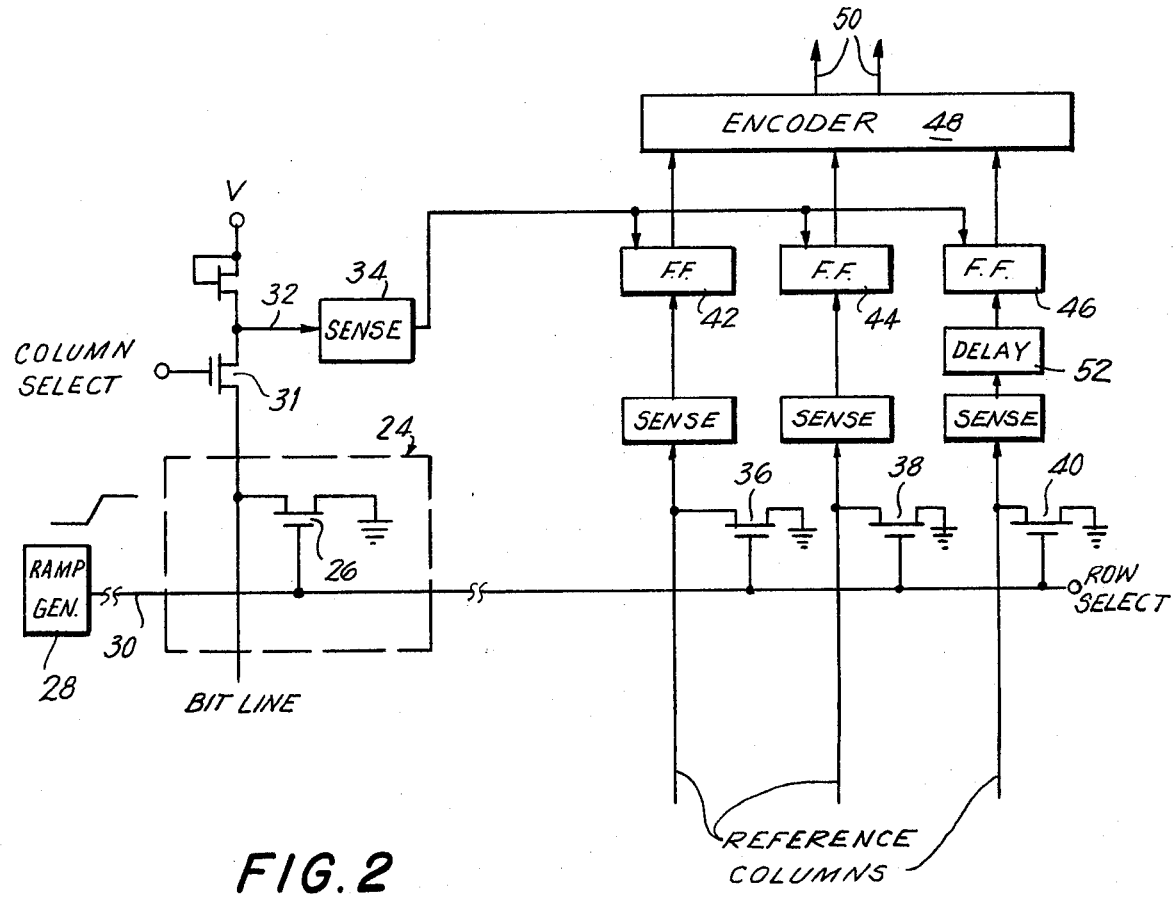
FIG. 2 is a schamtic drawing of a portion of a ROM according to the invention.

FIG. 2 is a schematic diagram showing part of an embodiment of the ROM of the invention. It includes a plurality of ROM cells, one of which 24 is shown. In the cell is a FET 26, which has one of three possible different thresholds at which it will turn on (for example −2.0 volts, +0.1 volts, or +0.7 volts), or is always inoperable, e.g. open circuit (for example, it has a cut in its source drain circuit). Thus FET 26 may present four different states.

A ramp generator 28 provides a ramp signal on a row select line 30 to cell 24. The ramp, for example, has a five volt rise, −2.5 to +2.5 volts in one micro second. It will be understood by those skilled in the art that the voltages given above are by way of example only and that for a typical N-channel MOS array, the ground plane of the array may be at a positive potential in order that all array devices may be cut off.

Assuming cell 24 is being sensed by a signal pulse on a column select gate 31, a rising ramp voltage on row select line 30 would trigger and switch transistor 26 when the voltage is either −2.0 volts and 100 nanoseconds (ns) into the ramp; or at +0.1 volts and 520 ns into the ramp; or at +0.7 volts and 640 ns into the ramp; or transistor 26 has an open circuit then it would not switch at all. An output signal from cell 24 appears on output 32, and goes to a sense amplifier 34 which shapes and amplifies the output.

The ramp signal is simultaneously applied on the row select to three transistors 36, 38 and 40, which have, respectively, the three different threshold levels which the transistors in the cells can have. In the example, transistor 36 becomes conducting at −2.0 volts; transistor 38 at 0.1 volt and transistor 40 at 0.7 volts; and become conducting approximately 100 ns, 520 ns, and 640 ns after the ramp signal begins. The output of the three transistors are applied to three sense amplifiers and then to one input of three flip-flops 42, 44, and 46, respectively.

The flip-flops each have a second input connected to receive the output from the cells via 32 and amplifier 34. Coincidence of signals on both inputs of a flip-flop causes it to change state and provide a signal on its output.

The state of the three flip-flops thus depend on the state or threshold of transistor 26, in cell 24, and may be summarized in the following chart.

| State of Transistor 26 | F-F 42 Output | F-F 44 Output | F-F 46 Output |
|---|---|---|---|
| −0.2 volt threshold | 1 | 1 | 1 |
| 0.1 volt | 0 | 1 | 1 |
| 0.7 volt | 0 | 0 | 1 |
| Inoperable | 0 | 0 | 0 |

The outputs of the flip-flops 42, 44 and 46 are connected to an encoder 48, which converts them to a binary code signal, which is outputted on a pair of lines 50. A typical encoder provides:

| ENCODER 48 | |
|---|---|
| Input | Output |
| 1 1 1 | 1 1 |
| 0 1 1 | 1 0 |
| 0 0 1 | 0 1 |
| 0 0 0 | 0 0 |

Thus from a single cell 24, there is provided at lines 50 four states of information.

In FIG. 2 it should be understood that the ROM chip contains additional circuitry (not shown), e.g. wave shaping amplifiers, buffers, input and output ports, multiplexing, and sequencing circuits, in addition to the other cells in the array of which there are several, and interconnections.

A delay circuit 52 may be included between transistor 40 and flip-flop 46. This is because transistor 40 switches very close in time to transistor 38, and it is easier to build a practical circuit; there is a little more delay. In the above example, a delay from device 52 of about 120 ns is desirable, as this spaces the time from the outputs of the three transistors 36, 38 and 40 approximately equally over the total time for reading each cell. Similar delays can be added to transistors 36 and 38.

Figure 3A:
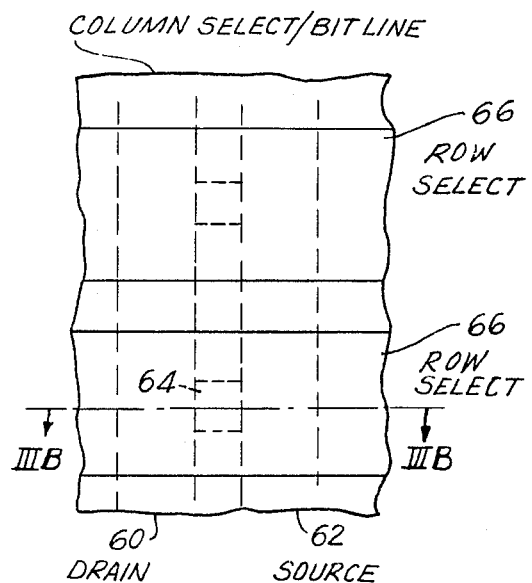
FIGS. 3A and 3B are plane and cross-sectional views, respectively, not to scale, of a metal gate FET of a cell according to the invention.
Figure 3B:
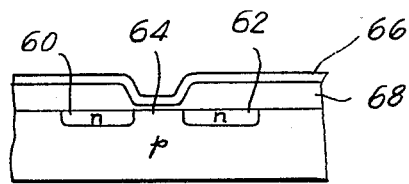

FIG. 3A is a plan view of an intergrated circuit chip showing part of two adjacent cells. Each cell has a FET with source and drain diffusions 60 and 62 and a gate region 64 between. FIG. 3B is a cross-sectional side view taken along line III-B of FIG. 3A. A thick oxide layer 68 is on top of the silicon surface. A gate metalization 66 corresponds to the row select line 30 of FIG. 2. It is approximately 14 microns ($10^{-6}$ meters) wide. An opening in the thick silicon oxide 68 defines the gate and is approximately 6 microns wide, and a distance between the drain and the source regions should be as small as possible, for example, 5.5 microns.

The gate surface area (5.5×6 microns) for each transistor in each cell is of the same size. For those transistors which are to have the intermediate threshold, in the example 0.1 volt, there is no further impurity in the gate region. For those transistors which are to have the −2.0 volts and +0.7 volts threshold there is an N & P implanted region below the gate for an enhancement and depletion type FET. It should be noted that regardless of what the threshold level, the size of gate surface area is the same.

Figure 4:
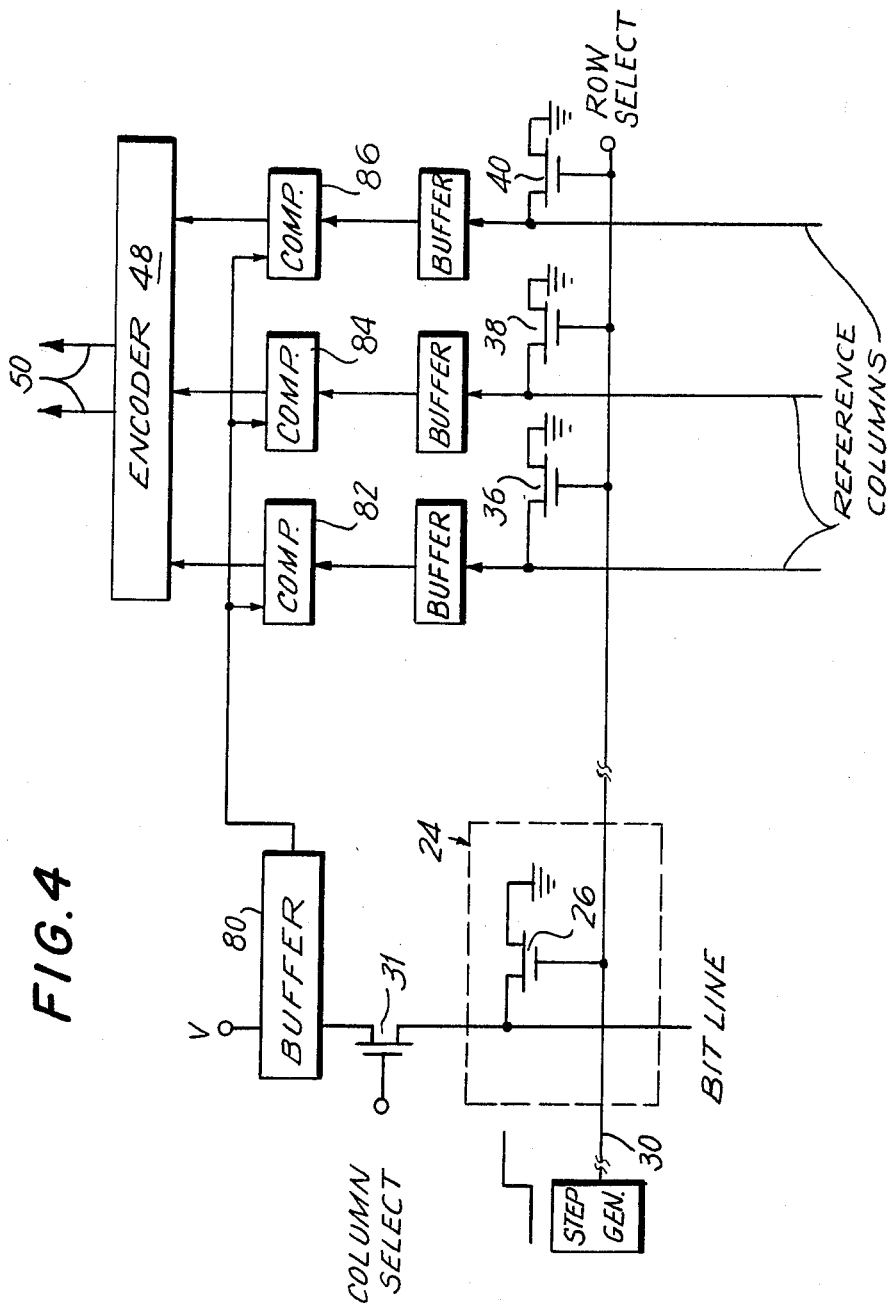
FIG. 4 is a schematic drawing of a portion of a ROM according to an alternative embodiment of the invention.

FIG. 4 shows an alternative embodiment ROM array. It is similar to that of FIG. 2, and like elements bear like legends. A step generator applies a step voltage, e.g. −2.5 to +2.5, with a rapid rise time to one row select 30. This switches all of the operable FETs 26 in the cells 24 on that row select line. Depending upon the threshold of the FETs 26 in the cells 24, or whether they are cut or not, i.e. inoperable, there will be different current flow in the column select line. For example, a depletion FET will draw 300 microamps; an undoped or E zero FET, 120 microamps; and an enhancement mode FET 50 microamps.

A buffer or current sense amplifier 80 is connected to a column select line, and provides the output from that column to comparison circuits 82, 84, and 86 described below.

Included in the ROW select line 30 are the three reference cells with FETs 36, 38, and 40. The output from these FETs 36, 38, and 40 are fed respectively to three buffers or current amplifiers, and then to one input of the comparison circuits 82, 84, 86, respectively. The second input to the comparison circuits comes from the buffer 80. Coincidence of signals at the comparison circuits triggers the circuit and provides an output signal to the encoder 48. The table of operation is identical to the one shown in this application at page 8, line 6–10, except in this embodiment it is the comparison output rather than the flip-flop output.

As with FIG. 2, the support circuitry for the ROM array is not shown, as that is known in the art. Various arrangements may be used for reading out the cells in a given row, e.g. by a tree arrangement, or other control in the bit line or row select. Other techniques are available depending upon the arrangement in which data is to be read out from the ROM.

With regard to the reference FETs 36, 38, and 40 in both FIGS. 2 and 4, it has been found desirable, in certain embodiments, to change the gate geometry from that of the geometry of the FETs of the array.

In the embodiment of FIG. 2, by changing this geometry, the timing at which the reference FETs trigger or switch can be adjusted; and the triggering of the FETs is more evenly spaced. This would avoid the need for the delay circuit 52. For example, the enhancement FET which triggers at 0.7 volts, has its gate size unchanged. It is the last one, of the reference FETs, to trigger. The reference FET with the undoped gate, might have it considerably larger, for example, 12×6 microns (source drain). This would cause it to switch first. A depletion mode FET would not be used at all as a reference, but an enhancement mode FET having a dimension of 10×6 microns (source drain) would also be used. This would trigger intermediately. These adjustments of the time of reference FETs switching also accomodates for other delays in the circuit, (e.g. between the outputs from the array FETs reaching the flip-flops).

It will be appreciated that the above dimensions are for example only, and other modifications may be made in the sizes of the reference FET gates, and using other combinations of doping besides the zero doping, enhancement depletion for the three reference flip-flops, some of the variables being the degree of doping, enhancement, depletion, or zero, and the size of the gate. Generally it is standard dopants that are used in fabrication and it is desirable to adapt one of those dopants when making the reference FET diffusions.

In an embodiment of FIG. 2, the sequence of signals reaching the flip-flops would be substantially, equally spaced in time, as follows: array depletion mode FETs switching; first reference FET switching; array zero doping FETs switching; second reference FET switching; enhancement mode FETs switching; third reference FET switching; and time for array inoperable FETs, which do not switch.

Also in the embodiment of FIG. 4, the reference FETs 36, 38, and 40 need not be of uniform gate dimensions. Also the doping may vary. In the example just given, the reference FETs may be two enhancement mode FETs of different gate dimensions; and one nondoped FET whose gate dimensions are different from those of the array FETs. Other combinations are possible, depending upon the amplitude of the currents to the comparison circuits and the timing of the currents. The turn-on time for all the FETs is relatively quick and at present a conservative cycle would be 300 nanoseconds. It should be noted that faster speeds may be obtained.

The invention has been described using three levels in an operating FET. By selected implantations, it is possible to introduce more than three threshold levels. Alternatively, by making different gate oxide thicknesses, different threshold levels may also be achieved; and other techniques are available for different thresholds. The present invention includes multiple threshold levels. Alternatively, to give more precise control a discrete staircase rather than a ramp input could be applied to the gate. Further, any slowly varying with time input signal might be used in FIG. 2 embodiment "Slowly varying with time" means that the output from the ROM cell is measured or sensed as a function of time. This can be contrasted with the FIG. 4 embodiment in which the output from the ROM cell is measured or sensed as a function of current amplitude from the cell.

It will be noted that as techniques are developed for smaller size FETs and interconnections, e.g. as the source and drain lines become closer together, and the metalization and gate region become smaller there will be an improved speed of operation, more cells per unit area, and larger arrays. The present invention, which doubles the output of each cell would also shrink in size with these further developments and take advantage of them.

I claim:

1. A read only memory comprising a plurality of multi-state cells interconnected in a ROM matrix, each of said cells comprising a FET, and the FET of each ROM cell having substantially the same surface area and shape, and having one of at least three possible states; means for selecting a particular one of said cells to be read; means for applying to a selected cell, an input signal varying in amplitude with time for stimulating an output signal from said cell in accordance with the state of said cell, said output signal being of one at least two possible amplitude levels; said input signal varies slowly with time, and said output signal being displaced in time depending upon the state of said cell.

2. A read only memory according to claim 1 wherein each cell has one of at least four states; three of said states are gate threshold levels responsive to different amplitudes of said input signal, and the fourth state is not operable by said input signal; said cell being switches at a different instant of time during the application of said input signal if in one of said first three states, and not being switched at all by said applied input signal if having said fourth state.

3. A read only memory according to claim 2 wherein the FET structure has a gate region having different degrees of doping corresponding to said three different states.

4. A read only memory according to claim 1, wherein one of said states causes said cell to remain unchanged during reading, and said output signal from said cells in said one state being of one amplitude level; and the output signals from said cells in the other states being the other amplitude level and displaced in time in accordance with their state.

5. A read only memory according to claim 4, further comprising at least three reference circuits connected to receive said input signal, each of said circuits having a cell in different one of said other states, and providing said time displaced output signal of said other amplitude in accordance with the state of said circuits; at least three flip-flops each having two inputs and an output, said first inputs being connected to the output of said at least three reference circuits respectively, and the second inputs being connected to receive the output of the cell being read; each of said flip-flops providing an output signal in accordance with coincidence of signals at its two inputs.

6. A read only memory in accordance with claim 5 further comprising an encoder connected to receive the output from the three flip-flops and providing a two bit binary signal in accordance with the output from the flip-flops.

7. A read only memory according to claim 5 further comprising a delay circuit between at least one of said reference circuits and the input to its corresponding flip-flop.

8. A read only memory according to claim 5, wherein said referenced circuits comprise three cells having FETs with substantially the same surface dimension as the cells in the ROM matrix.

9. A read only memory according to claim 5, wherein said multistate cells in the ROM matrix each comprise a FET having a gate region with different gate doping corresponding to said three threshold levels, and said three reference circuits each comprise a FET, at least one of which has one of said different gate doping of said matrix FETs, and a substantially different gate surface dimension than the corresponding FET cell in the matrix.

10. A read only memory according to claim 9, wherein at least two of said three reference circuits have FETs with surface gate dimensions different from those of the FETs in said matrix.

11. A read only memory in accordance with claim 10, wherein one of said reference cells FET is an enhancement mode, and with the same gate dimension as the FETs in the matrix; said second reference circuit FET being of the enhancement mode and with larger surface gate region, and said third reference circuit FET being of the intermediate threshold level and having a larger surface gate region.

* * * * *